United States Patent
Ghovanloo et al.

(10) Patent No.: US 7,881,409 B2
(45) Date of Patent: Feb. 1, 2011

(54) DEMODULATOR, CHIP AND METHOD FOR DIGITALLY DEMODULATING AN FSK SIGNAL

(75) Inventors: Maysam Ghovanloo, Raleigh, NC (US); Khalil Najafi, Ann Arbor, MI (US)

(73) Assignee: The Regents of the University of Michigan, Ann Arbor, MI (US)

(*) Notice: Subject to any disclaimer, the term of this patent is extended or adjusted under 35 U.S.C. 154(b) by 683 days.

(21) Appl. No.: 10/597,392

(22) PCT Filed: Jan. 21, 2005

(86) PCT No.: PCT/US2005/001945

§ 371 (c)(1),
(2), (4) Date: Mar. 16, 2007

(87) PCT Pub. No.: WO2005/071828

PCT Pub. Date: Aug. 4, 2005

(65) Prior Publication Data

US 2008/0169872 A1    Jul. 17, 2008

Related U.S. Application Data

(60) Provisional application No. 60/538,178, filed on Jan. 22, 2004.

(51) Int. Cl.
H04L 27/14 (2006.01)
(52) U.S. Cl. ............................................ 375/334
(58) Field of Classification Search ............ 375/334, 375/316, 322; 607/60
See application file for complete search history.

(56) References Cited

U.S. PATENT DOCUMENTS

| | | | |
|---|---|---|---|
| 3,372,234 A | 3/1968 | Rowsher et al. |
| 3,427,614 A | 2/1969 | Vinding |
| 3,501,704 A | 3/1970 | Webb |
| 3,512,087 A | 5/1970 | Lewis |
| 3,539,828 A | 11/1970 | Crouse |
| 3,600,680 A | 8/1971 | Maniere |
| 3,611,298 A | 10/1971 | Jacobson |
| 3,614,639 A | 10/1971 | Belman |

(Continued)

OTHER PUBLICATIONS

Troyk, P.R., et al., Development of BION Technology for Functional Electrical Stimulation: Bidirectional Telemetry, 23rd IEEE-EMBS Conference Proceedings, vol. 2, pp. 1317-1320, 2001.

(Continued)

*Primary Examiner*—Kevin M Burd
(74) *Attorney, Agent, or Firm*—Brooks Kushman P.C.

(57) ABSTRACT

A demodulator, chip and method for digitally demodulating an FSK signal utilizing a digital data transfer protocol and a digital demodulator circuit have been developed. The data-rate approaches the carrier-frequency. The one application for this technique is in the magnetically powered wireless systems such as biomedical implants and radio frequency identification (RFID) tags with high data rates above 1 Mbps. The demodulator circuit extracts the serial data bit-stream and a constant-frequency clock from an FSK carrier signal in the 1~20 MHZ range, which can power the wireless system as well. The digital demodulator circuit is implemented entirely with digital circuitry and is called a digital-FSK (DFSK) demodulator.

20 Claims, 5 Drawing Sheets

U.S. PATENT DOCUMENTS

| | | | |
|---|---|---|---|
| 3,623,075 A | | 11/1971 | Bench et al. |
| 3,636,454 A | | 1/1972 | Pasternack et al. |
| 3,660,771 A | | 5/1972 | Balugani et al. |
| 3,740,669 A | | 6/1973 | Nahay |
| 3,773,975 A | | 11/1973 | Koziol |
| 3,846,708 A | | 11/1974 | Franco |
| 3,908,169 A | | 9/1975 | Tong |
| 3,947,769 A | | 3/1976 | Rousos et al. |
| 3,949,313 A | | 4/1976 | Tamada et al. |
| 3,979,685 A | | 9/1976 | Motley et al. |
| 3,991,389 A | | 11/1976 | Dwire et al. |
| 4,010,323 A | | 3/1977 | Peck |
| 4,021,744 A | | 5/1977 | Monte Fusco |
| 4,066,841 A | * | 1/1978 | Young .................. 375/276 |
| 4,103,244 A | | 7/1978 | Tan |
| 4,115,738 A | | 9/1978 | Mitarai et al. |
| 4,363,002 A | | 12/1982 | Fuller |
| 4,368,439 A | | 1/1983 | Shibuya et al. |
| 4,451,792 A | | 5/1984 | Gay |
| 4,485,347 A | | 11/1984 | Hirasawa et al. |
| 4,485,448 A | | 11/1984 | Kurth |
| 4,486,715 A | | 12/1984 | Maas et al. |
| 4,488,120 A | | 12/1984 | Carsten |
| 4,513,427 A | | 4/1985 | Borriello et al. |
| 4,529,941 A | | 7/1985 | Lipoff |
| 4,533,874 A | | 8/1985 | Fischer |
| 4,543,953 A | | 10/1985 | Slocum et al. |
| 4,551,846 A | | 11/1985 | Takeda et al. |
| 4,568,882 A | | 2/1986 | Single |
| 4,616,187 A | | 10/1986 | Watanabe |
| 4,627,078 A | | 12/1986 | Stoner |
| 4,716,376 A | | 12/1987 | Daudelin |
| 4,752,742 A | | 6/1988 | Akaiwa |
| 4,773,085 A | | 9/1988 | Cordell |
| 4,825,452 A | | 4/1989 | Wong |
| 4,987,374 A | | 1/1991 | Burke |
| 5,053,717 A | | 10/1991 | Schulz et al. |
| 5,105,466 A | | 4/1992 | Tsujiuchi et al. |
| 5,155,446 A | | 10/1992 | Eberle et al. |
| 5,245,632 A | | 9/1993 | Greiss |
| 5,309,113 A | | 5/1994 | Mimura et al. |
| 5,317,309 A | | 5/1994 | Vercellotti et al. |
| 5,329,258 A | | 7/1994 | Matsuka |
| 5,394,109 A | | 2/1995 | Simard |
| 5,399,333 A | | 3/1995 | Kato et al. |
| 5,436,590 A | | 7/1995 | Simard |
| 5,533,061 A | | 7/1996 | Smith et al. |
| 5,550,505 A | | 8/1996 | Gaus, Jr. |
| 5,583,180 A | | 12/1996 | Boudreaux, Jr. et al. |
| 5,590,157 A | * | 12/1996 | Schuur .................. 375/327 |
| 5,621,755 A | | 4/1997 | Bella et al. |
| 5,649,296 A | | 7/1997 | MacLellan et al. |
| 5,684,837 A | | 11/1997 | Chen |
| 5,724,001 A | | 3/1998 | Chang |
| 5,748,036 A | | 5/1998 | Lee et al. |
| 5,781,064 A | | 7/1998 | Chang-An et al. |
| 5,953,386 A | | 9/1999 | Anderson |
| 6,038,268 A | | 3/2000 | Kawai |
| 6,122,329 A | | 9/2000 | Zai et al. |
| 6,144,253 A | | 11/2000 | Nemer |
| 6,307,413 B1 | | 10/2001 | Dalmia et al. |
| 6,359,942 B1 | | 3/2002 | Duggan et al. |
| 6,366,135 B1 | | 4/2002 | Dalmia et al. |
| 6,501,807 B1 | | 12/2002 | Chieu et al. |
| 2001/0002924 A1 | * | 6/2001 | Tajima .................. 375/271 |
| 2001/0021234 A1 | * | 9/2001 | Katayama et al. ........... 375/344 |
| 2002/0045920 A1 | * | 4/2002 | Thompson ................ 607/60 |
| 2002/0077710 A1 | * | 6/2002 | Harrington et al. ............ 700/13 |

OTHER PUBLICATIONS

Galbraith, D.G., et al., A Wideband Efficient Inductive Transdermal Power and Data Link With Coupling Insensitive Gain, IEEE Trans. Biomed. Eng. vol. 34, pp. 265-275, Apr. 1987.

Zierhofer, C.M., et al., The Class-E Concept for Efficient Wide-band Coupling-Insensitive Transdermal Power and Data Transfer, IEEE 14th EMBS Conference Proc., vol. 2, pp. 382-383, 1992.

Troyk, P.R., et al., Inductive Links and Drivers For Remotely-Powered Telemetry Systems, Antennas and Propagation Symposium, vol. 1, pp. 60-62, 2000.

Polk, C., et al., Handbook of Biological Effects of Electromagnetic Fields, Chap. 2, CRC Press, 1986.

Von Arx, J.A., et al., On-Chip Coils With Integrated Cores For Remote Inductive Powering of Integrated Microsystems, Transducers 97, pp. 999-10002, Jun. 1997.

Ghovanloo, M., et al., A BICMOS Wireless Interface Chip for Micromachined Stimulating Microprobes, IEEE-EMBS Special Topic Conference on Microtechnologies in Medicine and Biology Proceedings, pp. 277-282, Madison, Wisconsin, May 2002.

Ghovanloo, M., et al., A High Data Transfer Rate Frequency Shift Keying Demodulator Chip For The Wireless Biomedical Implants, IEEE 45th Midwest Symposium on Circuits and Systems Proc., Tulsa, Oklahoma, Aug. 2002.

Ghovanloo, M., et al., A Wideband Frequency-Shift Keying Wireless Link For Inductively Powered Biomedical Implants, IEEE Trans. on Circuits and Systems I, vol. 51, No. 12, pp. 2374-2383, Dec. 2004.

Ghovanloo, M., et al., A Modular 32-site Wireless Neural Stimulation Microsystem, IEEE Journal on Solid-State Circuits, vol. 39, No. 12, pp. 2457-2466, Dec. 2004.

Ghovanloo, M., et al., Fully Integrated Power Supply Design For Wireless Biomedical Implants, IEEE-EMBS Special Topic Conference on Microtechnologies in Medicine and Biology Proceedings, pp. 414-419, Madison, Wisconsin, May 2002.

* cited by examiner

(a) Time Domain

Clock Regenerator   Ring Oscillator   Digital Demodulator

DEMODULATOR, CHIP AND METHOD FOR DIGITALLY DEMODULATING AN FSK SIGNAL

CROSS-REFERENCE TO RELATED APPLICATION

This application claims the benefit of U.S. provisional application Ser. No. 60/538,178, filed Jan. 22, 2004 and entitled "Frequency Shift Keying Demodulation Methods for Wireless Biomedical Implants."

STATEMENT REGARDING FEDERALLY SPONSORED RESEARCH OR DEVELOPMENT

This invention was made with Government support from The National Institute of Health under Contract No. NIH-NINDS-N01-NS-9-2304. The Government has certain rights in the invention.

BACKGROUND OF THE INVENTION

1. Field of the Invention

This invention relates to demodulators, chips and methods for digitally demodulating FSK signals.

2. Background Art

The following references may be referenced herein:

[1] P. R. Troyk, I. E. Brown, W. H. Moore and G. E. Loeb, "Development of BION Technology for Functional Electrical Stimulation: Bidirectional Telemetry," 23rd IEEE-EMBS Conference Proceedings, Vol. 2, pp. 1317-1320, 2001.

[2] D. G. Galbraith, M. Soma, and R. L. White, "A Wideband Efficient Inductive Transdermal Power and Data Link with Coupling Insensitive Gain," IEEE TRANS. BIOMED. ENG. Vol. 34, pp. 265-275, April 1987.

[3] C. M. Zierhofer, E. S. Hochmair, "The Class-E Concept for Efficient Wide-band Coupling-insensitive Transdermal Power and Data Transfer," IEEE 14$^{th}$ EMBS Conference Proc., Vol. 2, pp. 382-383, 1992.

[4] P. R. Troyk and M. Edington, "Inductive Links and Drivers for Remotely-powered Telemetry Systems," Antennas and Propagation Symposium, Vol. 1, pp. 60-62, 2000.

[5] C. Polk, E. Postow, "Handbook of Biological Effects of Electromagnetic Fields," Chap. 2, CRC PRESS, 1986.

[6] J. A. Von Arx and K. Najafi, "On-Chip Coils with Integrated Cores for Remote Inductive Powering of Integrated Microsystems," TRANSDUCERS 97, pp. 999-1002, June 1997.

[7] M. Ghovanloo, K. Beach, K. D. Wise, and K. Najafi, "A BiCMOS Wireless Interface Chip for Micromachined Stimulating Microprobes," IEEEEMBS Special Topic Conference on Microtechnologies in Medicine and Biology Proceedings, pp. 277-282, Madison-Wis., May 2002.

[8] M. Ghovanloo and K. Najafi, "Fully Integrated Power Supply Design for Wireless Biomedical Implants," IEEE-EMBS Special Topic Conference on Microtechnologies in Medicine and Biology proceedings, pp. 414-419, Madison-Wis., May 2002.

[9] M. Ghovanloo and K. Najafi, "A High Data Transfer Rate Frequency Shift Keying Demodulator Chip for the Wireless Biomedical Implants," IEEE 45th Midwest Symposium on Circuits and Systems Proc., Tulsa-Okla., August 2002.

[10] M. Ghovanloo and K. Najafi, "A Wideband Frequency-Shift Keying Wireless Link for Inductively Powered Biomedical Implants," IEEE TRANS. ON CIRCUITS AND SYSTEMS I, Vol. 51, No. 12, pp. 2374-2383, December 2004.

[11] M. Ghovanloo and K. Najafi, "A Modular 32-site Wireless Neural Stimulation Microsystem," IEEE JOURNAL ON SOLID-STATE CIRCUITS, Vol. 39, No. 12, pp. 2457-2466, December 2004.

The inductive link between two magnetically-coupled coils is now one of the most common methods to wirelessly transfer power and data from the external world to implantable biomedical devices such as pacemakers and cochlear implants [1-3]. However, this is not the only application of data and power transfer via inductive coupling. Radio-frequency identification (RFID), remote sensing, and MEMS are among a few other fields that can benefit highly from this method [4]. Achieving high power transfer efficiency, high data transfer bandwidth, and coupling insensitivity are some of the challenges that one would face in the design of such systems.

Some of the biomedical implants, particularly those which interface with the central nervous system, such as cochlear and visual prostheses, need large amounts of data to simultaneously interface with a large number of neurons through multiple channels. In a simplified visual implant for example, a minimum reasonable resolution of only 32×32 pixels for an image requires 10-bits for addressing, 8-bits for 256 gray levels, and 2-bits for polarity and parity-checking. If one considers the human-eye natural bandwidth of 60 frames/sec, then 1.23 Mbps need to be transferred to this implant just as pure data. Therefore, a high data-rate receiver circuitry that can establish an efficient wireless link between the implant and the external units is highly needed.

In broadband wireless communications such as IEEE 802.11a standard for wireless LAN application, baud rates as high as 54 Mbps have been achieved at the expense of increasing the carrier frequency up to 5.8 GHz, giving a data-rate to carrier-frequency ratio of only 0.93%. In other words, each data bit is carried by 107.4 carrier cycles. On the other hand, the maximum carrier frequency for biomedical implants is limited to a few tens of MHZ due to the coupled coils' self-resonant frequency, more power loss in the power transfer circuitry, and excessive power dissipation in the tissue, which increases as square of the carrier frequency [5]. Therefore, a desirable goal is to transfer each data bit with a minimum number of carrier cycles to maximize the data-rate to carrier-frequency ratio and minimize the amount of power consumption.

So far, amplitude shift keying (ASK) data modulation has been commonly used in biomedical implants because of its fairly simple modulation and demodulation circuitry [1, 3, 4, 6, 7]. This method, however, faces major limitations for high-bandwidth data transfer, because high-bandwidth ASK needs high order filters with sharp cut-off frequencies, whose large capacitors cannot be easily integrated in this low-frequency range of RF applications. A remedy that has been proposed in the so called suspended carrier modulation [1, 3, 4] boosts the modulation index up to 100% to achieve high data rates with low-order integrated filters at the expense of 50% reduction in the transferred power.

Figures 1A, 1B, 2A:
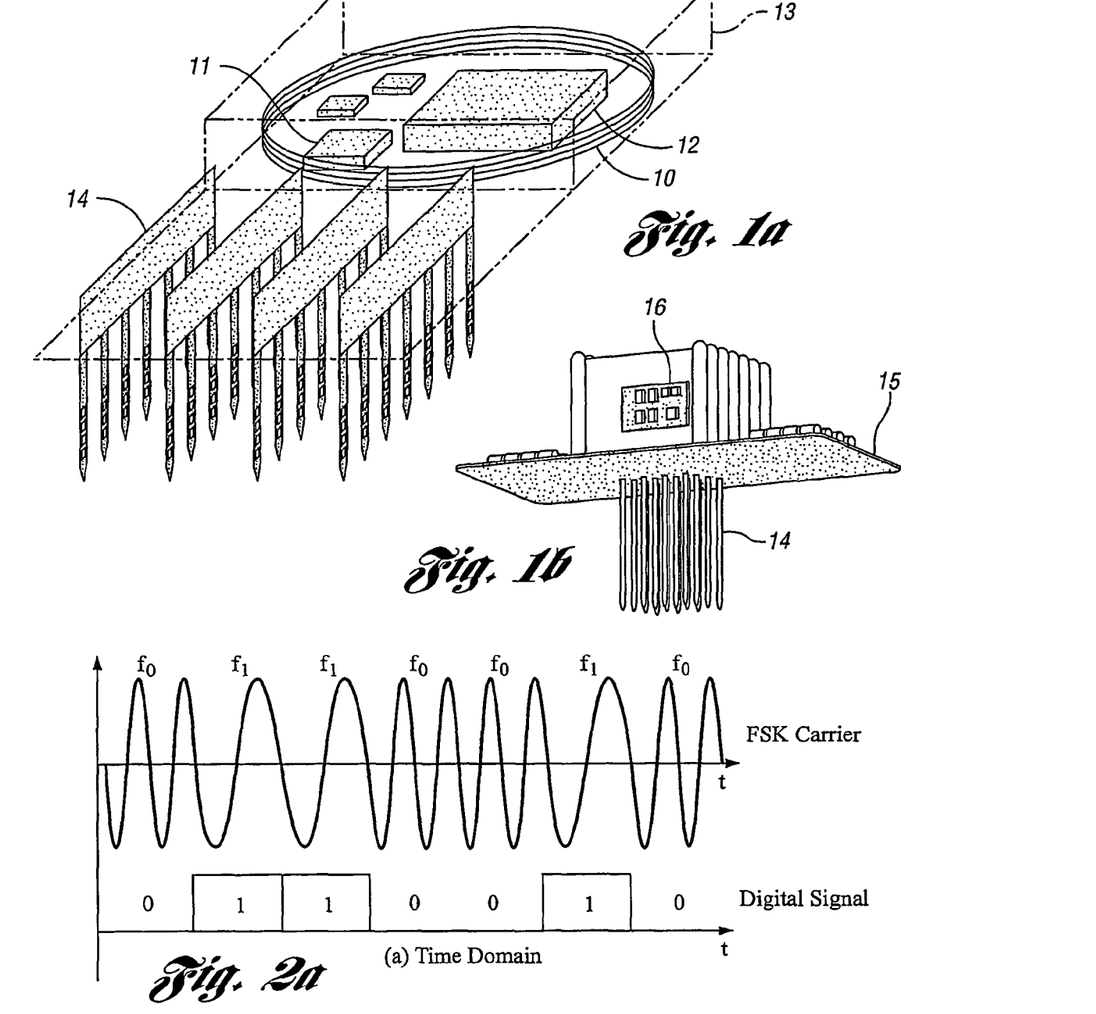
FIG. 1a is a schematic perspective view of a wireless 3D-microstimulator array with hybrid-coil and interface chip mounted on a micromachined platform.
FIG. 1b is a schematic perspective view of a hard-wired 3D-stimulator array [7,8]
FIGS. 2a and 2b are graphs which illustrate frequency shift keying in the time and frequency domains, respectively.

FSK data modulation technique has been was utilized for wirelessly operating the University of Michigan micromachined stimulating 3D-microprobes, shown in FIGS. 1a and 1b, which are targeted at a 1024-site wireless stimulating microsystem for visual and auditory prostheses [7,8]. A receiver coil 10, hybrid components 11 and a telemetry interface chip 12 are enclosed within a hermetic package 13. STIM 2/2B probe shanks 14 extend from a substrate 15 which supports electronic circuitry 16 thereon. This implantable microsystem consists of two major parts. First, a series of active (with circuitry) or passive (without circuitry) micromachined stimulating probes that are vertically mounted on a micromachined platform and second, a wireless interface chip that receives data and power through electromagnetic coupling and provides the entire system with regulated power, synchronization pulses and a serial data bit-stream.

FSK Data Transfer

FSK is one of the most common modulation techniques for digital communication, which simply means sending binary data with two frequencies $f_0$ and $f_1$, representing digital "0" and "1" respectively. The resultant modulated signal can be regarded as the sum of two complementary 100% amplitude-modulated signals at different carrier frequencies as shown in FIG. 2a.

$$f(t)=f_0(t)\sin(2\pi f_0 t+\phi)+f_1(t)\sin(2\pi f_1 t+\phi) \quad (1)$$

Figure 2B:
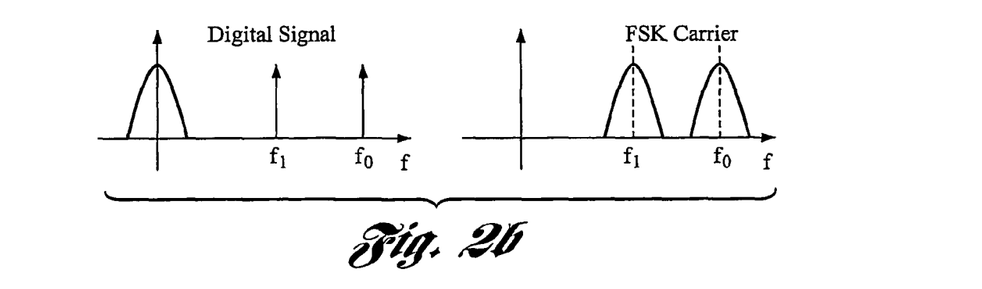

In the frequency domain, the signal power is centered at two carrier frequencies, $f_0$ and $f_1$, as shown in FIG. 2b. Since $f_0(t)$ and $f_1(t)$ can have the same amplitude, an excellent characteristic of the FSK modulation for wireless biomedical implants is that the transmitted power is always constant at its maximum level irrespective of $f_0$ and $f_1$ or the data content:

$$|f_0(t)| = |f_1(t)| = V_m \Rightarrow V_{rms}(f) = \frac{1}{\sqrt{2}} V_m \quad (2)$$

Another difference between the FSK and ASK is that in ASK data transmission the receiver tank circuit frequency response should have a very high quality factor (Q), centered at the carrier frequency to get enough amplitude variation for data detection. However, in FSK data transmission, the pass band should be centered between $f_0$ and $f_1$ with a low Q to pass enough power of both carrier frequencies. This is an advantage for the FSK technique because in the biomedical implant applications, the quality factor of the receiver coil is inherently low particularly when the implant receiver coil is integrated and its high resistivity is unavoidable [6]. The FSK signal is much less susceptible to the coupled coils misalignment and motion artifacts which are two major problems in biomedical implants that adversely affect the amplitude of the received signal.

Synchronization of the receiver with the transmitter is however easier in the ASK systems. Because the receiver internal clock signal can be directly derived by stepping down the constant transmitter carrier frequency [6, 7]. In FSK data transfer, the internal clock with constant frequency can be derived from a combination of the two carrier frequencies ($f_0$ and $f_1$) based on the data transfer protocol or synchronization patterns.

One wants to maximize the data-rate to carrier frequency ratio. Therefore, a particular protocol was devised for the FSK data transfer with the data-rate as high as $f_1$ with $f_0$ twice as $f_1$. In this protocol, the digital bit "1" is transmitted by a single cycle of the carrier $f_1$ and the digital bit "0" is transmitted by two cycles of the carrier $f_0$ as shown in FIG. 2a. The transmitter frequency switches at a small fraction of a cycle and only at zero crossings. This leads to a consistent data transfer rate of $f_1$ Bits/sec. As a result, if one considers the average carrier frequency to be $(f_0+f_1)/2$, then the data-rate to carrier frequency ratio can be as high as 67%. It is also useful to notice that any odd number of consecutive $f_0$ cycles in this protocol is an indication of data transfer error.

The following U.S. patents are related to the invention: U.S. Pat. Nos. 5,684,837; 4,616,187; 3,611,298; 3,623,075; 4,021,744; 3,979,685; 3,846,708; 3,908,169; 5,533,061; 4,115,738; 3,660,771; 5,550,505; 4,551,846; 3,600,680; 5,399,333; 4,488,120; 5,649,296; 4,485,347; 4,368,439; 4,825,452; 6,144,253; 4,103,244; 4,987,374; 5,748,036; 5,155,446; 4,568,882; 4,752,742; 5,245,632; 4,486,715; 4,533,874; 4,529,941; 6,359,942; 5,724,001; 6,038,268; 3,636,454; 6,501,807; 3,539,828; 4,010,323; 5,953,386; 4,773,085; 3,512,087; 3,501,704; 3,947,769; 5,053,717, 3,614,639; 3,949,313; 4,485,448; 5,436,590; 5,394,109; 4,716,376; 5,309,113; 3,427,614; 5,583,180; 4,363,002; 4,513,427; 6,307,413; 5,317,309; 6,122,329; 3,740,669, 4,451,792; 5,781,064; 5,329,258; 3,773,975; 3,991,389; 5,621,755; 6,366,135; 5,105,466; 3,372,234; and 4,543,953.

References [9] and [10] disclose a high-rate frequency shift keying (FSK) data transfer protocol and demodulator circuit for wirelessly operating biomedical implants in need of data transfer rates above 1 Mbit/Sec. The demodulator circuit receives the serial data bit stream from an FSK carrier signal in 2-20 MHZ range, which is used to power the implant through inductive coupling.

The data detection technique used for the FSK demodulation is based on measuring the period of each received carrier cycle. If the period is higher than a certain value, a digital "1" bit is detected and otherwise a digital "0" is received. Time measurement is provided by charging a capacitor with a constant current source and monitoring its voltage. Charging and discharging of this capacitor is synchronized with the FSK carrier signal. If the capacitor voltage is higher than a certain value, a digital "1" bit is detected and otherwise a digital "0" is received. This comparison can be done in two ways:

1. Fully differential FSK demodulator (FDFSK): Charging two unequal capacitors with different currents and compare their voltages with a hysteresis comparator. This is like comparing two capacitive timers with different time constants.
2. Referenced Differential FSK Demodulator (RDFSK): Generating a reference voltage and comparing it with a charging capacitor voltage.

Such a demodulator circuit is usually a part the analog portion of a mixed signal chip and, in some cases, it is the only analog block on the chip. Analog blocks usually occupy more area than their digital counterparts. Specifically, the common FSK demodulation techniques need some kind of analog filtering down the signal path, which consume even more chip area due to the above-noted low-end RF application. Analog circuits are more susceptible to process and temperature variations and their design becomes more challenging with the trend towards smaller feature size and lower power supply voltage. Therefore, a fully digital demodulator can save a lot of chip area, make the system more robust, and ease many of the above problems.

SUMMARY OF THE INVENTION

An object of the present invention is to provide an improved demodulator, chip and method for digitally demodulating an FSK signal wherein at least one of the above-noted problems associated with the prior art is at least partially solved.

In carrying out the above object and other objects of the present invention, in a high data rate receiver for an FSK data transmission system having a data transfer protocol, a digital demodulator for demodulating an FSK signal having a data rate from a carrier signal having a pair of carrier frequencies is provided. The digital demodulator generates a serial data bit stream based on the FSK carrier signal and generates a synchronized constant frequency clock signal from the carrier frequencies based on the data transfer protocol for sampling the serial data bit stream. Both the data transfer protocol and the demodulator are fully digital to make the system robust.

The data rate may be greater than one million bits per second.

The data rate may approximate the carrier frequencies.

The carrier frequency may be less than about 25 megahertz and more than about 1 megahertz.

One of the carrier frequencies may be approximately twice the other carrier frequency so that a duration of each data bit is substantially the same, independent of its value.

The demodulator may also detect an error in the FSK carrier signal based on the protocol and provides a corresponding error signal.

The demodulator may also digitally measure the period of each received positive half cycle of the FSK carrier signal to obtain a series of pulses which distinguish between long and short FSK carrier cycles.

The demodulator may include an n-bit counter that runs with a clock time-base, $f_{TB}$, having a substantially constant frequency at a rate substantially higher than the FSK carrier frequencies, $f_1$ and $f_0$, to digitally measure the periods.

The system may be a magnetically powered wireless system.

The receiver may be a wireless biomedical implant.

Further in carrying out the above object and other objects of the present invention, an FSK demodulator chip for an FSK data transmission system having a fully digital data transfer protocol is provided. The chip includes a substrate and a digital demodulator formed on the substrate for demodulating an FSK signal having a data rate from a carrier signal having a pair of carrier frequencies. The demodulator generates a serial data bit stream based on the FSK carrier signal and generates a synchronized constant frequency clock signal from the carrier frequencies based on the data transfer protocol for sampling the serial data bit stream. The demodulator is fully digital to minimize the amount of surface area occupied by the demodulator on the substrate.

The data rate may be greater than one million bits per second.

The data rate may approximate the carrier frequencies.

The carrier frequency may be less than about 25 megahertz and more than about 1 megahertz.

One of the carrier frequencies may be approximately twice the other carrier frequency so that a duration of each data bit is substantially the same, independent of its value.

The demodulator may also detect an error in the FSK carrier signal based on the protocol and provides a corresponding error signal.

The demodulator may also digitally measure the period of each received positive half cycle of the FSK carrier signal to obtain a series of pulses which distinguish between long and short FSK carrier cycles.

The demodulator may include an n-bit counter that runs with a clock time-base $f_{TB}$, having a substantially constant frequency at a rate substantially higher than the FSK carrier frequencies, $f_1$ and $f_0$, to digitally measure the periods.

The system may be a magnetically powered wireless system.

Still further in carrying out the above object and other objects of the present invention, a method for demodulating an FSK signal having a data rate from a carrier signal having a pair of carrier frequencies in an FSK transmission system having a digital data transfer protocol is provided. The method includes digitally measuring the period of each received positive half cycle of the FSK carrier signal to obtain a series of pulses which distinguish between long and short FSK carrier cycles. The method also includes digitally generating a serial data bit stream based on the FSK carrier signal and the series of pulses. The method further includes digitally generating a synchronized constant frequency clock signal from the carrier frequencies based on the digital data transfer protocol and the series of pulses.

The above object and other objects, features, and advantages of the present invention are readily apparent from the following detailed description of the best mode for carrying out the invention when taken in connection with the accompanying drawings.

BRIEF DESCRIPTION OF THE DRAWINGS

FIGS. 7a and 7b illustrate a number of D-FSK measured waveforms at 200 Kbps with $f_0$ and $f_1$ equal to 8 MHZ and 4 MHZ respectively; FIG. 7a shows counter MSB $C_2$, Data-out, $CK_{in}$, and Data-in [2 μs/div]; FIG. 7b shows Clock-out, Data-out, Carrier, and Data-in [500 ns/div];

DETAILED DESCRIPTION OF THE PREFERRED EMBODIMENTS

In general, an improved demodulator, chip and method for digitally demodulating an FSK signal is described herein. In this digital approach, the received FSK carrier is dealt with as a base-band signal. The data detection technique used here for the FSK demodulation is based on digitally measuring the period of each received carrier cycle. If the period is higher than a certain value, a digital "1" bit is detected and otherwise a digital "0" is received.

As previously described, a simple method for time measurement in an analog circuit is charging a capacitor with a constant current source and monitoring its voltage [9, 10]. However, in a digital circuit one can count a constant frequency clock time-base ($f_{TB}$) at a rate several times higher than the carrier frequency. Most often this internal clock, which does not need to be synchronized with the carrier, is already available in the system for running other digital circuits or the processor. An n-bit counter runs while the carrier is "positive" and measures half of a carrier cycle. When the carrier goes "negative", the counter stops and a digital comparator decides whether a long or short carrier cycle has been received by comparing the count value with a constant reference. Then it resets the counter for measuring the duration of the next cycle.

The time-base period ($1/f_{TB}$) should be smaller than the time-difference between $f_0$ and $f_1$ half-cycles for the demodulator to be able to discriminate between these two frequencies. In other words $f_{TB}$ should be chosen based on:

$$f_{TB} > \frac{2f_1 f_0}{f_0 - f_1} \quad (3)$$

Therefore, the minimum width of the counter (n) should satisfy:

$$2^n > f_{TB}/f_0. \quad (4)$$

In order to make the demodulator circuit simpler and reduce dynamic power consumption, the digital comparator can be omitted by choosing $f_0$, $f_1$, $f_{TB}$ and n so that:

$$f_0 > f_{TB}/2^n > f_1. \quad (5)$$

In this case, the most significant bit (MSB) of the counter determines whether a long or short carrier cycle has been received and the constant reference value is equal to $2^n$.

Figure 3A:
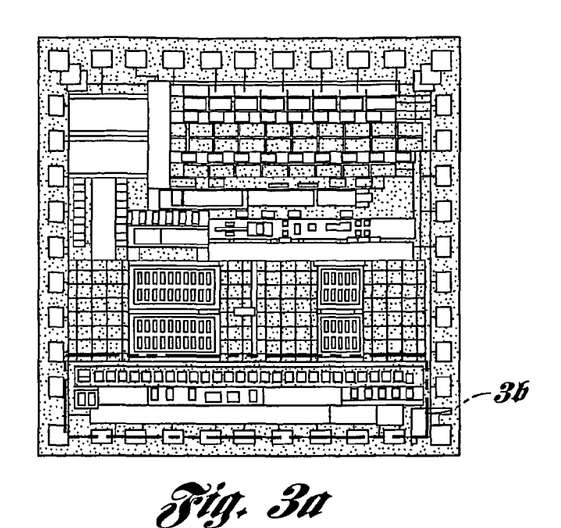
FIG. 3a is a top plan view of a D-FSK demodulator prototype chip which illustrates its floor plan.
Figure 3B:
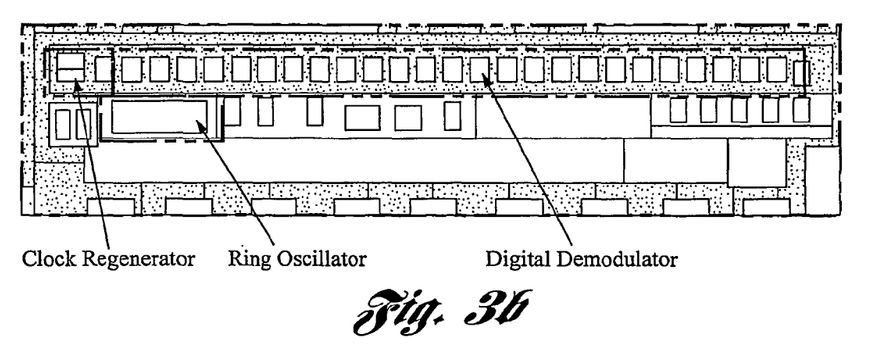
FIG. 3b is an enlarged portion of the chip of FIG. 3a being labeled with circuit components.

This algorithm was implemented in a prototype chip, which is shown in FIG. 3 and fabricated in the AMI 1.5 μm 2M/2P standard-CMOS process. Even though processes with much smaller feature size are available, this process was chosen mainly because of its high voltage option, which is important for the stimulating blocks of the wireless stimulating microsystem shown in FIG. 1a in order to overcome high site impedance when injecting current into the neural tissue. According to the FSK data-transfer protocol $f_0$ and $f_1$ were chosen equal to 8 MHZ and 4 MHZ, respectively, to achieve data-rates as high as 4 Mbps. By choosing these frequencies for the carrier, (3) sets a lower limit for the time-base clock ($f_{TB}$>16 MHZ); and by choosing n=3, (5) defines a new range for $f_{TB}$ (64 MHZ>$f_{TB}$>32 MHZ), which satisfies (3) as well. Therefore, a 7-stage ring-oscillator was designed to generated $f_{TB}$=49 MHZ at the middle of the above range. It should be noted that as long as $f_{TB}$ is in the desired range, the phase noise and frequency variations of this oscillator do not affect the demodulation process.

Figure 4:
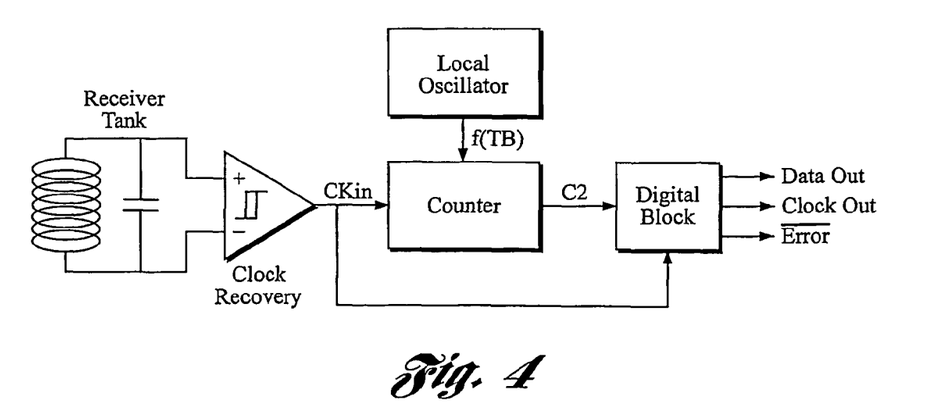
FIG. 4 is a generalized block diagram schematic view of a D-FSK demodulator constructed in accordance with one embodiment of the present invention.
Figure 5:
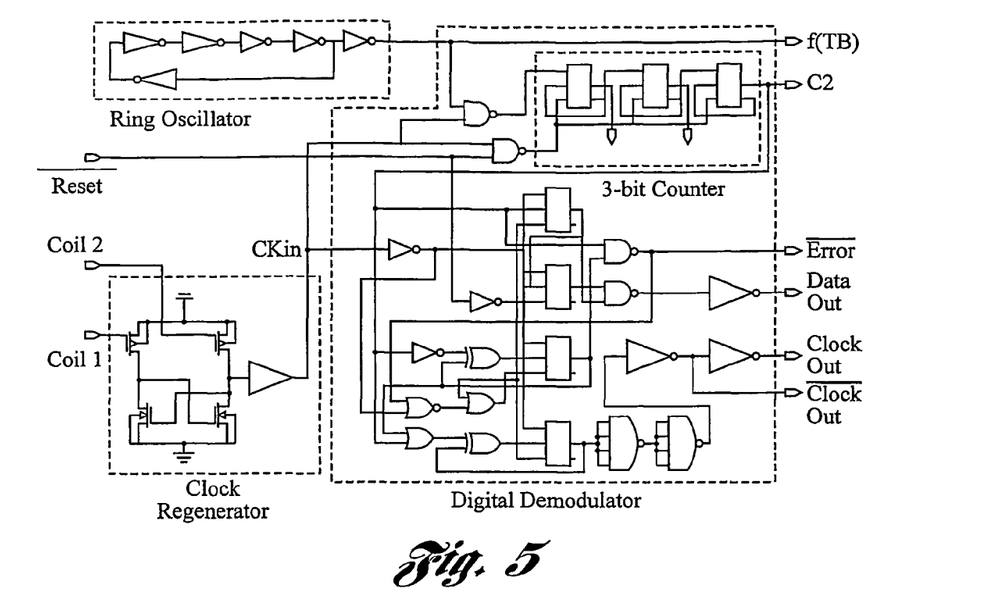
FIG. 5 is a circuit schematic view of a D-FSK demodulator constructed in accordance with one embodiment of the present invention.
Figure 6:
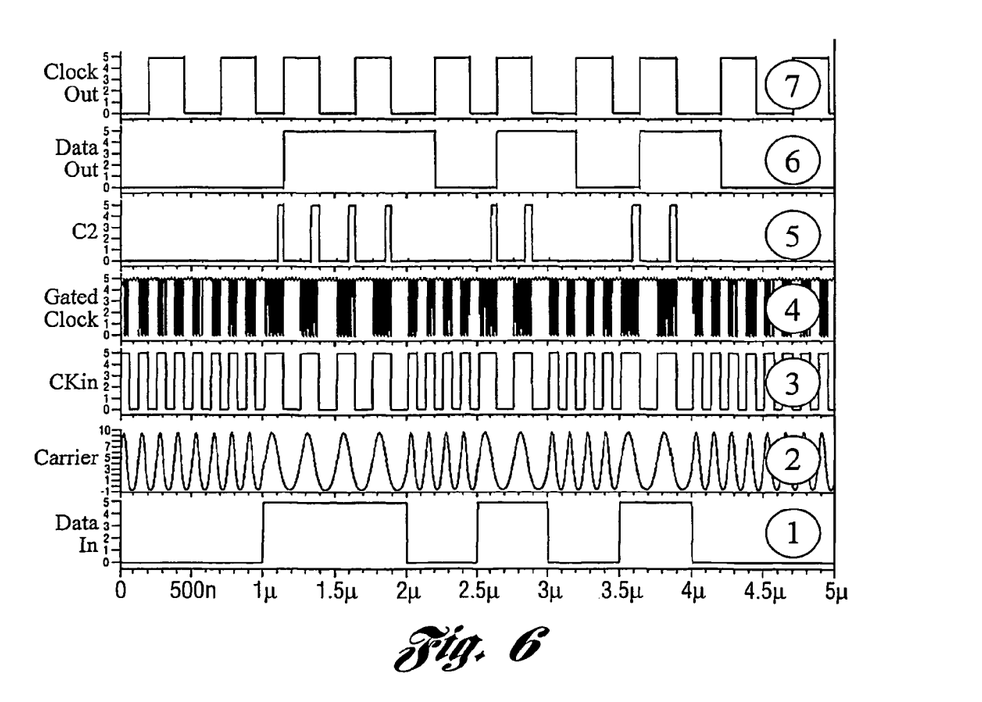
FIG. 6 illustrates a number of D-FSK demodulator simulated waveforms.

FIG. 4 shows a generalized block diagram schematic view of the D-FSK demodulator, FIG. 5 shows a schematic diagram of the D-FSK demodulator, and FIG. 6 shows sample simulation waveforms when a "00111100110011" data bit-stream is FSK modulated and applied to the D-FSK demodulator circuit {1}. The clock-regenerator circuit is a cross-coupled differential pair, which is directly connected to the receiver coil and turns the sinusoidal FSK carrier signal {2} into a similar square digital waveform called $CK_{in}$ {3}. Utilization of a positive feedback in this circuit helps generate sharp output edges, which are important for precise timing of the carrier cycles. The internal ring-oscillator generates a time-base clock at $f_{TB}$, which runs the 3-bit counter after being gated by $CK_{in}$ {4}. When $CK_{in}$ is high, the counter is running, however it freezes when $CK_{in}$ is low. The counter MSB ($C_2$) stays low during short (62.5 ns) carrier half-cycles when count<4, but goes high during long (125 ns) carrier half-cycle when count>4 {5}. The counter also resets when $CK_{in}$ goes low during the $2^{nd}$ carrier half-cycle to be ready for detecting the type of the next cycle.

The MSB of the counter ($C_2$) provides only a series of pulses, which discriminate between long and short FSK carrier cycles {5}. Therefore, it cannot be directly regarded as the received data bit stream. These pulses are fed into a digital block along with $CK_{in}$ {3} to generate the serial data output (Data-Out) {6} and a constant frequency clock (Clock-Out) {7}. On every rising edge of the $C_{in}$, a 2-bit shift register shifts in the $C_2$ pulses. Every 2 successive short cycles should be regarded as a "0" bit on Data-Out and every single long cycle indicates a "1" bit. Any odd number of short cycles is an indication of error according to the FSK protocol and activates the error flag. To generate a constant frequency clock, a T flip-flop indicates the number of successive zeros and another T flip-flop toggles on every long $CK_{in}$ cycle or two successive short $CK_{in}$ cycles. The resulting clock frequency is constant at $f_1/2$ irrespective of the data contents and the data values should be read at both rising and falling edges of the Clock-Out signal.

Measurement Results

Figure 7A:
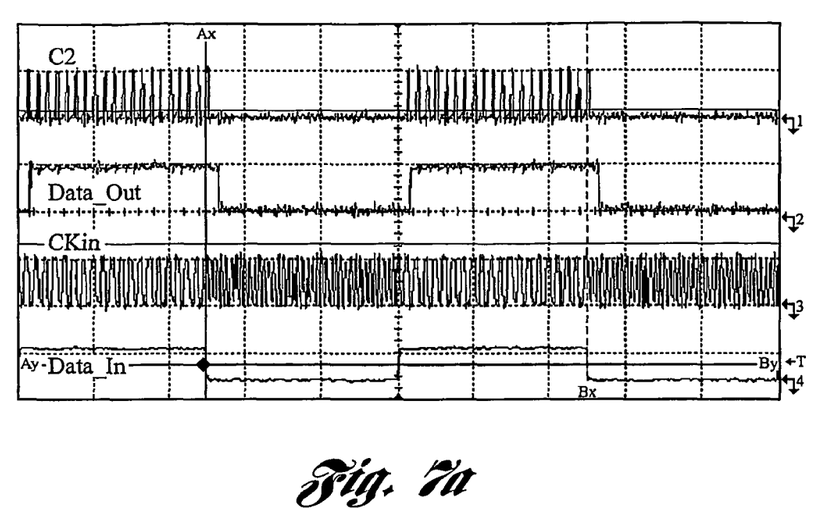
Figure 7B:
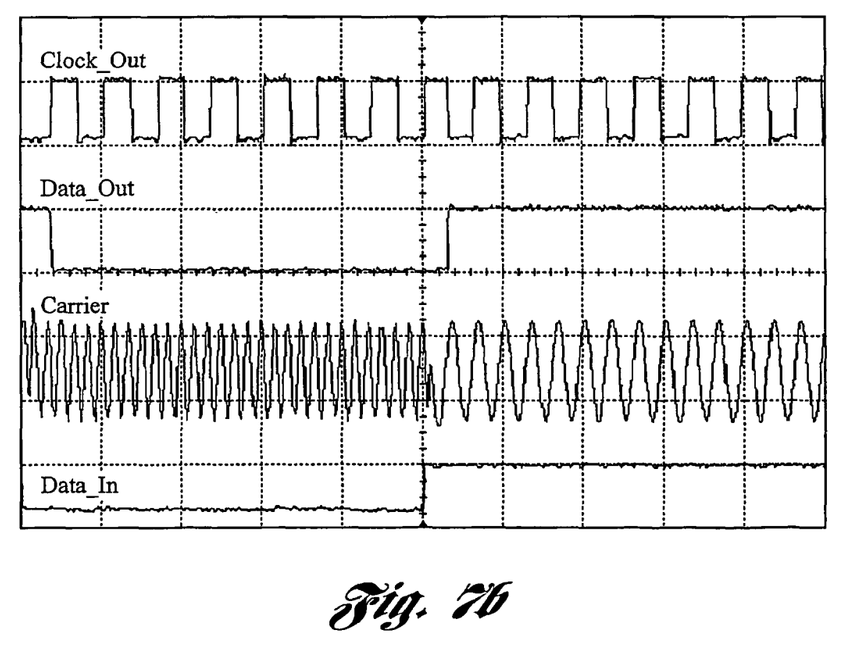

The ring-oscillator, clock regenerator, and digital demodulator blocks were tested both individually and together as a digital FSK demodulator chip. With a 5V supply, the ring-oscillator generates $f_{TB}$ at 50.5 MHZ, which is very close to the target value (49 MHZ) and inside the desired range. FIG. 7 shows some of the measured waveforms, while $f_0$ and $f_1$ are set to 8 MHZ and 4 MHZ, respectively. All of the traces are labeled according to their names in the simulation and circuit diagrams. It can be seen that the FSK demodulator chip is functioning as expected from the simulations, up to 200 Kbps, which is the highest FSK modulation rate of our function generator (Agilent 33250A). A transmitter is capable of modulating up to 10 Mbps serial data bit-stream out of a fast digital I/O card (National Instruments DAQ-6534). Table 1 summarizes some of the specifications of the D-FSK demodulator chip.

TABLE 1

SPECIFICATIONS OF THE D-FSK DEMODULATOR CHIP

| | |
|---|---|
| Process Technology | AMI 1.5 μm 2 M/2P Std-CMOS |
| Die size | 2.2 mm × 2.2 mm |
| Circuit area | 0.29 mm² (2.41 mm × 0.12 mm) |
| Carrier frequency | 4~20 MHZ |
| Maximum data rate | 4 Mbps with 8 MHZ carrier |
| Time-base frequency | 50.5 MHZ |
| Counter Width (n) | 3-bits |
| Supply voltage | 5 V |
| Power dissipation | 0.38 mW at 200 Kbps |

The measured results that are reported in reference [10], page 2380 (also FIG. 12, page 2381) are at much higher rate than the ones mentioned here (i.e., 2.5 MBit/sec vs. 200 kBit/sec). Also, reference [10], page 2381, FIG. 12, shows measured waveforms that are at much higher rates than the ones shown in FIGS. 7a and 7b.

Wideband Inductive Link

Detailed design of the inductive link for biomedical implants is described in [2]-[3]. Almost all of these inductive links are designed for narrowband carrier signals, which is not the case in the proposed FSK modulation scheme. The main problem with a narrow bandwidth in high-speed FSK data transfer is inter-symbol interference, which is caused by the residual ringing that distorts the received carrier signal when the transmitter switches from one frequency to another.

The Carlson's rule approximates the necessary bandwidth (BW) to include 98% of the total power of an FM signal:

$$BW \approx 2(\delta_{max} + f_{imax}) \quad (6)$$

where $\delta_{max}$ is the maximum frequency shift caused by modulation and $f_{imax}$ is the maximum frequency content of the modulating signal. In the proposed FSK protocol, $\delta_{max} = f_1/2$ with respect to $f_{avr}$ and the maximum data rate of $f_1$ can be considered as a square waveform $f_1/2$. Therefore, the main lobe of data spectrum has a maximum frequency of $f_{imax} = f_1$. By substituting these values in (6), a bandwidth of $BW \approx 3f_1$ is needed to include 98% of the FSK carrier power. However, it should be noted that contrary to the analog FM, here the goal is not a direct reconstruction of the data waveform, but correct detection of the data values. The experimental measurements show that an inductive link with half of the estimated bandwidth (1.5 $f_1$) can still provide an acceptable bit error rate (BER) in a system equipped with error detection circuitry.

Figure 8A:
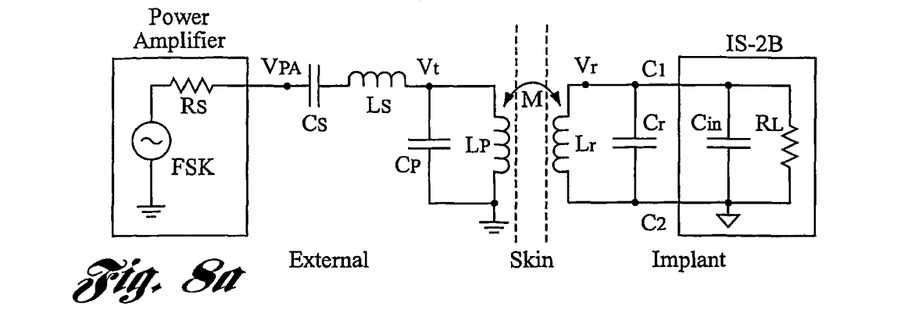
FIG. 8a is a schematic model of the combined series-parallel LC-tank with $L_p$ used as the transmitter coil.

The easiest way to increase the inductive link bandwidth is to lower the quality factor (Q) of the transmitter and receiver tank circuits by adding resistive components. However, the resulting increase in power dissipation especially in the implantable side is not desirable. Another method is to modify the transmitter output spectrum by adding two zeros at $f_0$ and $f_1$, where the peaks of the FSK carrier spectral power are located. FIG. 8a shows a simplified schematic diagram of the modified inductive link. The external parts of the system are replaced with an AC source and a source resistance ($R_S$), whereas the implant is replaced by a resistive load ($R_L$) and its parasitic input capacitance ($C_{in}$). A combination of both series and parallel LC-tank circuits are used to generate two zeroes across the FSK source output nodes at $f_0$ and $f_1$. It can be shown analytically that this condition will be satisfied if $L_S$–C, and $L_P$–$C_P$ are chosen such that:

$$\frac{1}{2\pi\sqrt{L_P C_P}} = \frac{1}{2\pi\sqrt{L_S C_S}} = \sqrt{f_0 f_1} = f_m \quad (7)$$

$$\frac{1}{2\pi\sqrt{L_S C_P}} = f_1 \quad (8)$$

$$\frac{1}{2\pi\sqrt{L_P C_S}} = f_0 \quad (9)$$

Figure 8B:
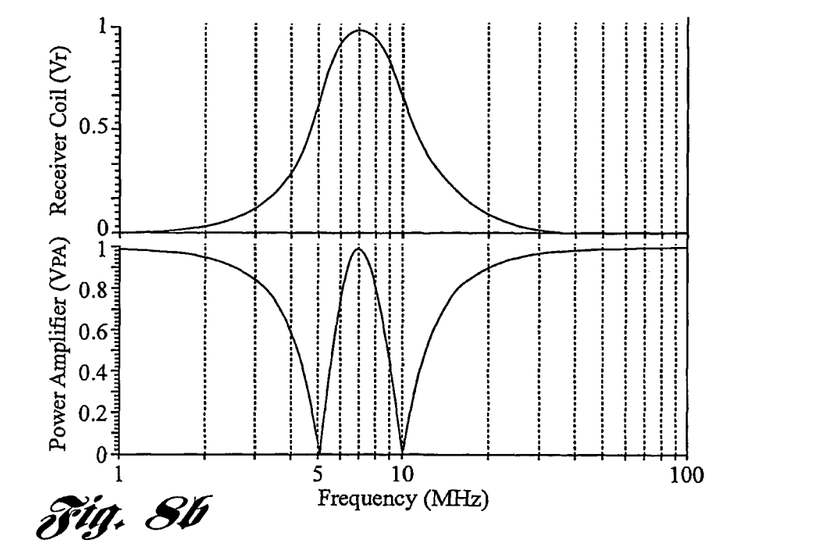
FIG. 8b shows a simulated spectrum of the power amplifier output ($V_{PA}$) and the received signal ($V_r$)
Figure 8C:
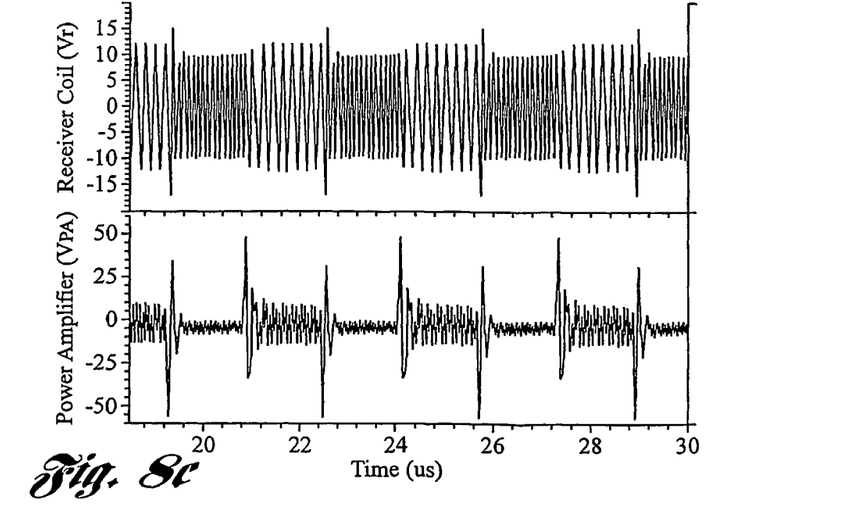
FIG. 8c shows $V_{PA}$ and $V_r$ simulated waveforms in the time domain.

In this series-parallel LC-tank combination, either $L_P$ or $L_S$ can be considered as the transmitter coil ($L_t$). The effect of the receiver coil ($L_r$) and its loading ($C_r$, $C_{in}$, and $R_L$) is neglected in the above calculations, because the mutual coupling between the two coils (M) is usually very small. FIG. 8b shows the simulated spectrums of $V_{FSK}$ and $V_r$, the voltages across the FSK source output and the receiver coil, when the circuit parameters are chosen based on Table 2. It can be seen that the zeros at $f_0$ and $f_1$ have provided a –3 dB bandwidth of about $f_1$ across $L_r$ without any additional resistive components. The time-domain waveform of the received FSK carrier signal ($V_r$) in FIG. 8c shows that the carrier frequency switches immediately with no residual ringing. FIG. 8c also shows that $f_0$ and $f_1$ are suppressed at the FSK source output ($V_{FSK}$) and there are only spikes at the frequency switching points due to the other unsuppressed frequency components that become significant at these points.

TABLE 2

THE WIRELESS LINK CIRCUIT PARAMETERS

| Parameter | Value | Comment |
|---|---|---|
| $C_S$ | 0.5 nF | Series tank capacitor |
| $L_S$ | 1 µH | Series tank inductor |
| $C_P$ | 1 nF | Parallel tank capacitor |
| $L_P$ | 0.5 µH | Parallel tank inductor |
| $N_P$ | 3 | Parallel inductor turns |
| $D_P$ | 30 mm | Parallel inductor diameter |
| $C_r$ | 10 pF | Receiver tank capacitor |
| $L_r$* | 9 µH | Receiver tank inductor |
| $N_r$ | 15 | Receiver inductor turns |
| $D_r$ | 12 mm | Receiver inductor diameter |
| $d_r$ | 5 mm | Distance between $L_r$ and $L_P$ planar coils |
| M | 100 nH | Mutual inductance between $L_r$ and $L_P$ |
| $C_{in}$ | 10 pF | Wireless chip parasitic input capacitance |
| $R_L$ | 1 kΩ | Wireless chip loading |
| $R_S$ | 50 Ω | Transmitter output resistance |

*The receiver coil has a ferrite core.

SUMMARY

A high-rate digital FSK data transfer protocol and demodulator circuit for wirelessly operating systems such as biomedical implants and radio frequency identification (RFID) tags has been described. However, it can be used for any other wireless application, which needs above 1 Mbps data transfer rate through an inductive link. The input clock ($CK_{in}$) is regenerated from the FSK carrier in 1~20 MHZ range, which is used to power the implant as well. The serial data bit-stream and a constant frequency clock are then extracted from $CK_{in}$. The chip has been designed and fabricated in the AMI 1.5 µm standard CMOS process, occupying an area of 0.29 mm². The prototype chip and its individual blocks have been simulated up to 2 Mbps and tested up to 200 Kpbs and were fully functional.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A high data rate wireless receiver for an FSK data transceiver system having a data transfer protocol, and a carrier signal having a pair of carrier frequencies, the receiver having a signal path and including a digital FSK demodulator for demodulating an FSK signal by measuring the period of incoming carrier signal cycles using a high frequency local clock time-base, $f_{TB}$, the FSK demodulator demodulating the FSK signal having a data rate from the carrier signal, the digital FSK demodulator generating a serial data bit stream based on the FSK carrier signal and generating a synchronized constant frequency clock signal from the carrier frequencies based on the data transfer protocol for sampling the serial data bit stream wherein the frequency of the local clock time-base is substantially higher than the carrier frequencies to digitally measure periods of each received half cycle of the FSK carrier signal wherein the demodulator discriminates between carrier frequencies regardless of data rate and wherein the data transfer protocol, the FSK demodulator and the receiver are all fully digital without the need for analogue circuits in the signal path of the receiver to make the system small, low power and robust.

2. The receiver as claimed in claim 1, wherein the data rate is greater than one million bits per second.

3. The receiver as claimed in claim 1, wherein the data rate approximates the carrier frequencies.

4. The receiver as claimed in claim 1, wherein the carrier frequency is more than about 1 megahertz.

5. The receiver as claimed in claim 1, wherein one of the carrier frequencies is twice the other carrier frequency so that a duration of each data bit is substantially the same, independent of its value.

6. The receiver as claimed in claim 1, wherein the receiver also detects an error in the FSK carrier signal based on the protocol and provides a corresponding error signal.

7. The receiver as claimed in claim 1, wherein the receiver digitally measures the period of each received half cycle of the FSK carrier signal to obtain a series of pulses which distinguish between long and short FSK carrier cycles.

8. The receiver as claimed in claim 7, wherein the receiver includes an n-bit counter that runs with a clock time-base, $f_{TB}$, having a substantially constant frequency at a rate substantially higher than the FSK carrier frequencies, $f_1$ and $f_0$, to digitally measure the periods.

9. The receiver as claimed in claim 1, wherein the system is a magnetically powered wireless system.

10. The receiver as claimed in claim 9, wherein the receiver is a wireless biomedical implant.

11. A chip for an FSK data transceiver system having a fully digital data transfer protocol and a carrier signal having a pair of carrier frequencies, the chip comprising:
    a substrate; and
    a receiver having a signal path and including a digital FSK demodulator formed on the substrate for demodulating an FSK signal by measuring the period of incoming carrier signal cycles using a high frequency local time-base $f_{TB}$, the FSK demodulator demodulating the FSK signal having a data rate from the carrier signal wherein the receiver generates a serial data bit stream based on the received FSK carrier signal and generates a synchronized constant frequency clock signal from the carrier frequencies based on the data transfer protocol for sampling the serial data bit stream wherein the frequency of the local clock time-base is substantially higher than the carrier frequencies to digitally measure periods of each received half cycle of the FSK carrier signal wherein the demodulator discriminates between carrier frequencies regardless of data rate and wherein the receiver is fully digital without the need for analogue circuits in the signal path of the receiver to minimize the power consumption and the amount of surface area occupied by the demodulator on the substrate and to make the system robust.

12. The chip as claimed in claim 11, wherein the data rate is greater than one million bits per second.

13. The chip as claimed in claim 11, wherein the data rate approximates the carrier frequencies.

14. The chip as claimed in claim 11, wherein the carrier frequency is more than about 1 megahertz.

15. The chip as claimed in claim 11, wherein one of the carrier frequencies is twice the other carrier frequency so that a duration of each data bit is substantially the same, independent of its value.

16. The chip as claimed in claim 11, wherein the receiver also detects an error in the FSK carrier signal based on the protocol and provides a corresponding error signal.

17. The chip as claimed in claim 11, wherein the demodulator also digitally measures the period of each received half cycle of the FSK carrier signal to obtain a series of pulses which distinguish between long and short FSK carrier cycles.

18. The chip as claimed in claim 17, wherein the demodulator includes an n-bit counter that runs with a clock time-base $f_{TB}$, having a substantially constant frequency at a rate substantially higher than the FSK carrier frequencies, $f_1$ and $f_0$, to digitally measure their periods.

19. The chip as claimed in claim 11, wherein the system is a magnetically powered wireless system.

20. A method for receiving and demodulating an FSK signal having a data rate from a carrier signal having a pair of carrier frequencies in an FSK transceiver system having a receiver signal path, the system having a digital data transfer protocol, the method comprising:
    digitally measuring the period of each received positive half cycle of the FSK carrier signal using a high frequency local clock time-base, $f_{TB}$ to obtain a series of pulses which distinguish between long and short FSK carrier cycles;
    digitally generating a serial data bit stream based on the FSK carrier signal and the series of pulses; and
    digitally generating a synchronized constant frequency clock signal from the carrier frequencies based on the digital data transfer protocol and the series of pulses wherein the frequency of the local clock time-base is substantially higher than the carrier frequencies to digitally measure periods of each received half cycle of the FSK carrier signal wherein the demodulator discriminates between carrier frequencies regardless of data rate and wherein the method is performed in a fully digital fashion without the need to perform any steps in the signal path in an analogue fashion to make the system small, low power and robust.

* * * * *